United States Patent [19]

Honma et al.

[11] Patent Number: 5,693,581

[45] Date of Patent: Dec. 2, 1997

[54] METHOD OF MANUFACTURING A PYROLYTIC BORON NITRIDE COMPACT

[75] Inventors: Junichi Honma; Kotaro Mino, both of Tokyo, Japan

[73] Assignee: Advanced Ceramics Corporation, Lakewood, Ohio

[21] Appl. No.: 725,130

[22] Filed: Oct. 2, 1996

[30] Foreign Application Priority Data

Oct. 3, 1995 [JP] Japan ................. 7-278269

[51] Int. Cl.$^6$ ................................. C04B 35/58
[52] U.S. Cl. .............. 501/96; 423/290; 427/255.1; 427/255.2; 264/81
[58] Field of Search ................ 501/96; 423/290; 427/255.1, 255.2; 264/81

[56] References Cited

U.S. PATENT DOCUMENTS

| | | | |
|---|---|---|---|
| 4,402,925 | 9/1983 | Shinko et al. | 423/290 |
| 4,690,841 | 9/1987 | Tanji et al. | 423/290 |
| 4,849,146 | 7/1989 | Tanji et al. | 427/255.2 |
| 5,021,371 | 6/1991 | Mignani et al. | 423/290 |
| 5,275,844 | 1/1994 | Moore | 427/255.1 |

FOREIGN PATENT DOCUMENTS 63-37637   2/1988   Japan .

*Primary Examiner*—Karl Group
*Attorney, Agent, or Firm*—Eugene Lieberstein; Michael N. Meller

[57] ABSTRACT

In accordance with the present invention a pyrolytic boron nitride compact having an electrical resistivity smaller than about $10^{14}$ Ω-cm is formed by the process of introducing a feed gas of gaseous boron halide and ammonia at a suitable ratio into a furnace heated to a temperature between 1600° C. to 2200° C. with the furnace containing a substrate of graphite to form a deposit of pyrolytic boron nitride upon said substrate, substantially simultaneously introducing a hydrocarbon gas into the furnace to form a codeposit of carbon in the crystal structure of the pyrolytic boron nitride deposit, controlling the mole fraction of said hydrocarbon gas to limit the concentration of carbon to less than about 3 wt % of the pyrolytic boron nitride composition.

6 Claims, 2 Drawing Sheets

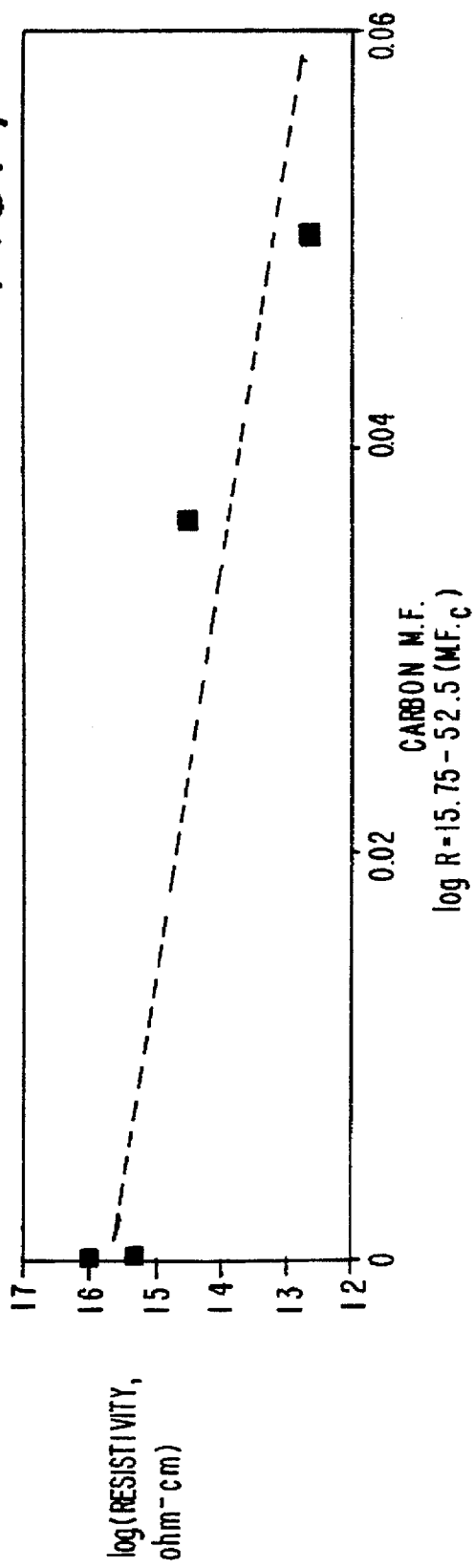
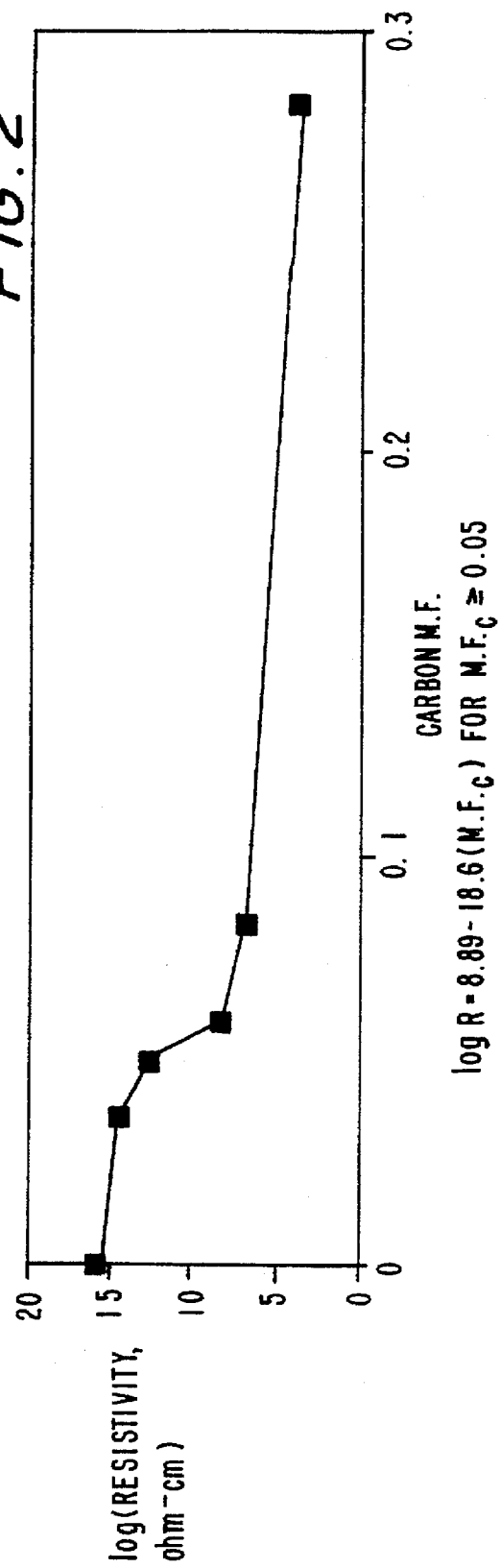

METHOD OF MANUFACTURING A PYROLYTIC BORON NITRIDE COMPACT

FIELD OF INVENTION

This invention relates to a pyrolytic boron nitride compact having a resistivity smaller than $10^{14}$ Ω-cm and preferably between $10^8$ Ω-cm and $10^{13}$ Ω-cm and to a method of manufacture.

BACKGROUND OF THE INVENTION

Pyrolytic boron nitride is conventionally formed by chemical vapor deposition (CVD) involving the reaction of a gaseous boron halide and ammonia in a heated furnace under controlled temperature conditions between 1600° C. to 2200° C. as is taught in U.S. Pat. No. 3,182,006 the disclosure of which is herein incorporated by reference. The above identified CVD process forms an essentially pure boron nitride product having an electrical resistivity of greater than $10^{15}$ Ω-cm. Although a high electrical resistivity is a necessary characteristic of an electrical insulator there are other applications for a boron nitride ceramic material having a controlled resistivity smaller than $10^{15}$ Ω-cm and preferably less than $10^{14}$ Ω-cm. For example when pyrolytic boron nitride is used to form the helix coil support element in a traveling wave tube a power loss problem exists due to the deviation or deceleration of the electron beam. This is believed to be attributable to the accumulation of electrostatic fields and electrical charges in the pyrolytic boron nitride material. Pyrolytic boron nitride is also currently used to form an insulating film in a ceramic electrostatic chuck in the process of semiconductor wafer fabrication. An increase in the electrostatic chuck clamping force may be achieved when a very weak electric current is permitted to flow through the insulating film due to what is referred to in the art as the "Johnsen-Rahbek effect". It has been shown in accordance with the present invention that the Johnsen-Rahbek contribution can be enhanced in a ceramic electrostatic chuck when the resistivity of the pyrolytic boron nitride material is held to a value smaller than $10^{14}$ Ω-cm and preferably below $10^{13}$ Ω-cm, It is even more desirable if the resistivity of the pyrolytic boron nitride material can be controlled and/or preset within a resistivity range between $10^8$ Ω-cm and $10^{13}$ Ω-cm,

SUMMARY OF THE INVENTION

It was discovered in accordance with the present invention that pyrolytic boron nitride can be formed with a resistivity preset to a value smaller than $10^{13}$ Ω-cm and preferably between $10^8$ Ω-cm and $10^{13}$ Ω-cm by altering the CVD process to introduce a gaseous hydrocarbon into the heated furnace during the reaction between the boron halide and ammonia gases resident in the furnace so as to cause a codeposition of pyrolytic boron nitride and carbon. Moreover the flow ratio of the hydrocarbon gas can be controlled such that the electrical resistivity of the codeposit is below $10^{14}$ Ω-cm. The flow conditions should be adjusted such that the methane inlet concentration is uniformly dependent upon the mole fraction of carbon in the pyrolytic boron nitride crystal structure. The electrical resistivity of the codeposit is then selectable within a given range as a function of carbon content. The electrical resistivity of the composite can be adjusted to a resistivity between $10^8$ Ω-cm and $10^{13}$ Ω-cm by maintaining the carbon concentration in the composite at a level of between 3 wt % and less than 1 wt %.

A pyrolytic boron nitride compact having an electrical resistivity value smaller than $10^{13}$ Ω-cm is formed in accordance the present invention by the process of introducing a feed gas of gaseous boron halide and ammonia at a suitable ratio into a furnace heated to a temperature between 1600° C. to 2200° C. with the furnace containing a substrate of graphite for forming a pyrolytic boron nitride deposit upon said substrate, substantially simultaneously introducing a hydrocarbon gas into the furnace to deposit carbon into the crystal structure of the pyrolytic boron nitride deposit, controlling the mole fraction of said hydrocarbon gas to limit the concentration of carbon to a value above zero and less than 3 wt % of the composition of the pyrolytic boron nitride and separating the composite from the substrate.

BRIEF DESCRIPTION OF THE DRAWINGS

Other advantages of the present invention will become apparent from the following detailed description of the invention when read in conjunction with the accompanying drawings of which:

FIG. 1 is a graph showing the relationship between resistivity and carbon mole fraction for a codeposit of carbon and pyrolytic boron nitride up to a carbon mole fraction of 0.06;

FIG. 2 is a graph similar to FIG. 1 showing the relationship between resistivity and carbon mole fraction over an extended mole fraction range;

DETAILED DESCRIPTION OF THE INVENTION

Pyrolytic boron nitride can be produced by a vapor phase reaction between a boron halide preferably boron trichloride and ammonia as taught in U.S. Pat. No. 3,152,006 the disclosure of which is herein incorporated by reference. Boron nitride is deposited upon a suitable substrate such as a graphite having any desired shape. A pyrolytic boron nitride (PBN) compact is produced by separating the pyrolytic boron nitride coating from the substrate.

In accordance with the present invention a hydrocarbon gas, for example, methane gas, is introduced into the reaction chamber during the growth of the PBN crystal structure causing the hydrocarbon gas to simultaneously pyrolyze into a pyrolytic graphite form of carbon. Pyrolytic graphite is essentially highly oriented polycrystalline graphite produced by high temperature pyrolysis of a hydrocarbon gas such as methane, ethane, ethylene, natural gas, acetylene and propane.

Apparently when PBN is codeposited with pyrolytic graphite (PG), the PBN is deposited at nearly the same rate as compared to a pure PBN deposit. The rate of carbon codeposition is smaller by a factor $\geq 20$ than for a pure deposit because ammonia removes deposited carbon as HCN. HCN production during codeposition is much greater than when PBN is produced alone.

As is evident from FIG. 1 the codeposition of carbon in PBN causes the electrical resistivity of the codeposit to uniformly vary as a function of the carbon mole fraction of the deposit up to a carbon mole fraction of about 0.06. At a mole fraction above about 0.06 corresponding to a carbon concentration of about 3 wt % an abrupt transistion occurs in the relationship of electrical resistivity and carbon concentration as is evident from FIG. 2. The "Knee" of the curve in FIG. 2 indicates that the conduction mechanism changes at a carbon mole fraction above about 0.06. Accordingly, the electrical resistivity of the boron nitride deposit can be uniformly adjusted, albeit not linearly, within a preset range by controlling the carbon concentration in the PBN deposit.

Figure 3:
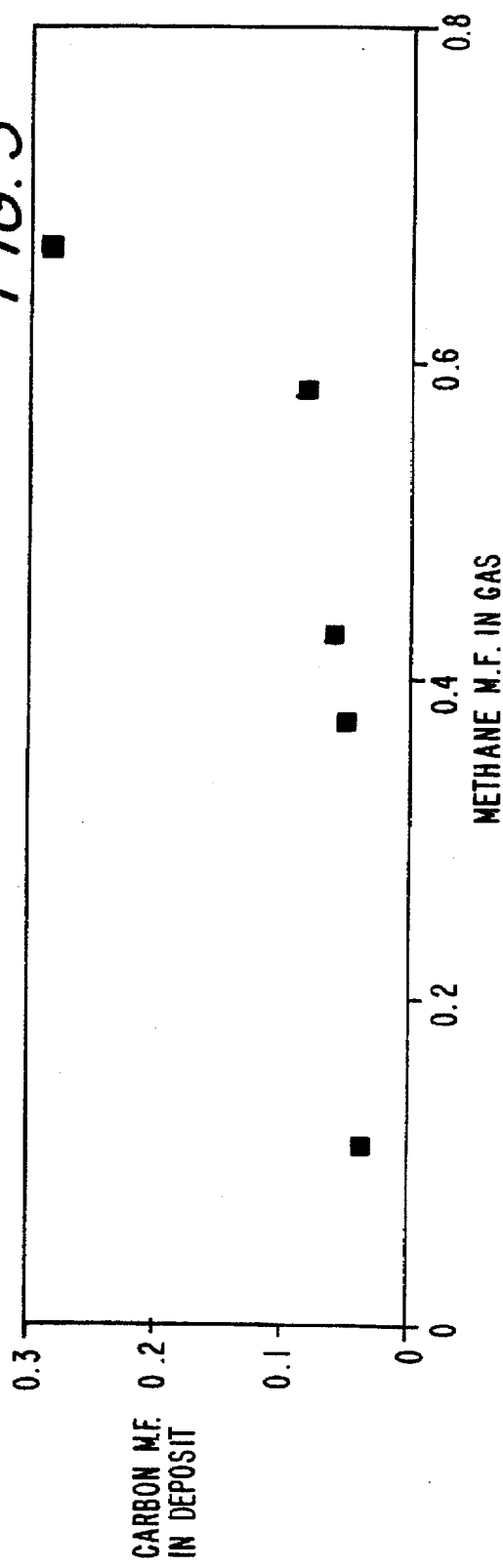
FIG. 3 is a graph of the carbon mole fraction in the deposit as a function of the mole fraction of the hydrocarbon methane gas.

FIG. 3 shows the relationship between the mole fraction of carbon in the PBN deposit as a function of the mole fraction of methane when used as the hydrocarbon gas. Carbon mole fraction in the deposit is a smooth and slowly increasing function of methane mole fraction up to a mole fraction equal to about 0.08. Good control of desired carbon mole fraction can thus be maintained by controlling the inlet methane concentration. The electrical resistivity may then be preset by appropriate fine tuning of the methane mole fraction. Electrical resistivities for the PBN compact between $10^8$ Ω-cm and $10^{14}$ Ω-cm may be preset by establishing carbon concentrations in the deposit between above zero and 3 wt % as substantiated by the data in table 1 shown below

TABLE I

| Sample | Gas percentage for BCl3 = 1 mole | | Amount of Carbon added | Electrical resistivity |
| --- | --- | --- | --- | --- |
| | $NH_3$ | $CH_4$ | wt % | $\pi = cm$ |
| No. 1 | 3 | 0.5 | 1.8 | $3.1 \times 10^{14}$ |
| 2 | 3 | 2.4 | 2.5 | $4.3 \times 10^{12}$ |
| 3 | 3 | 3.0 | 3.0 | $2.1 \times 10^8$ |
| 4 | 3 | 5.6 | 4.2 | $5.4 \times 10^6$ |
| 5 | 3 | 8.0 | 16 | $5.0 \times 10^3$ |

As evident from Table 1 the electrical resistivity of the PBN composite can be adjusted to a value smaller than $10^{13}$ Ω-cm and preferably between $10^8$ Ω-cm and $10^{13}$ Ω-cm by adjusting the carbon concentration in the composite to a level preferably between above zero "0" wt % and 3 wt %. Table 1 substantiates that the electrical resistivity of the PBN compact can be controlably decreased by the addition of carbon. However, above a carbon concentration of 3 wt % the mechanical strength of the PBN compact is dramatically affected. The samples in examples 4 and 5 exhibited cracks in several places.

Figure 4:
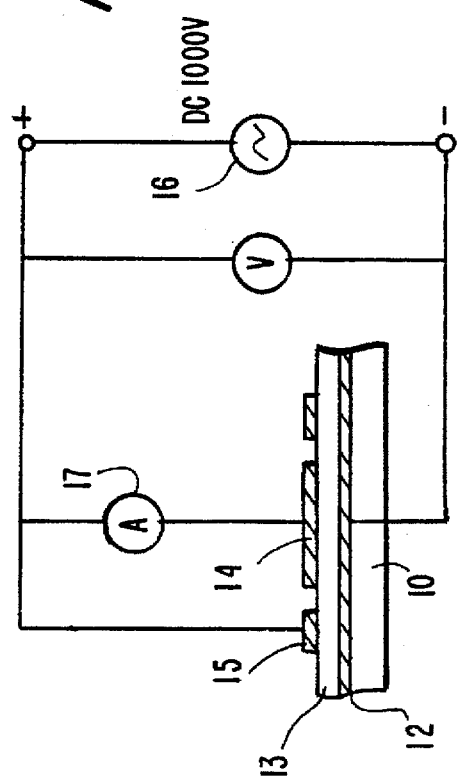
FIG. 4 is a schematic of the electrical circuit arrangement used to measure the electrical resistivity of the pyrolytic boron nitride sample.

The results of Table 1 were compiled from data obtained from the schematic circuit arrangement of FIG. 4. The circuit of FIG. 4 includes a PBN substrate 10 having the shape of a disk with a thickness of, for example, 2 mm and a diameter of 100 mm. A pyrolytic graphite (PG) layer 12 is precipitated upon the substrate 10, preferably by CVD, to a thickness of, for example, 50 μm. The PG layer 12 forms a counter electrode for measuring the electrical resistivity of a carbon doped PBN sample 13 formed by CVD as follows: 3 moles of ammonia and 1–8 moles of methane gas to one mole of boron trichloride were reacted at a pressure of 0.5 Torr and at a temperature of 1850° C. to precipitate the PBN sample 13 upon the PG layer 12. Conductive plate-like electrodes 14 and 15 are affixed or formed upon the PBN doped sample 13 in a dipolar configuration. A DC voltage source 16 is connected between the electrode 14 and the PG layer 12 and an ammeter 17 is connected between the electrode 14 and the DC source 16. Five samples were prepared by changing the percentage flow of methane gas between 1 and 8 moles. The concentration of carbon in the sample may be analyzed by any conventional method such as infrared absorption.

What we claim is:

1. A method for forming a pyrolytic boron nitride product having an electrical resistivity smaller than $10^{14}$ Ω-cm comprising the steps of introducing a feed gas of gaseous boron halide and ammonia at a suitable ratio into a furnace containing a graphite substrate, heating the furnace to a temperature between 1600° C. to 2200° C., introducing a gaseous hydrocarbon into the heated furnace so as to cause a codeposition of pyrolytic boron nitride and carbon upon said substrate and controlling the flow ratio of the hydrocarbon gas such that the electrical resistivity of the codeposit has a value of less than about $10^{14}$ Ω-cm and a carbon concentration below a maximum of about 3 wt %.

2. A method as defined in claim 1 wherein said gaseous hydrocarbon is selected from the class consisting of methane, ethane, ethylene, natural gas, acetylene and propane.

3. A method as defined in claim 2 wherein said gaseous hydrocarbon is methane.

4. A method as defined in claim 3 wherein the carbon mole fraction in said codeposit is below about 0.06.

5. A method as defined in claim 4 wherein the resistivity of said codeposit is preset to within a resistivity between $10^8$ Ω-cm and $10^{13}$ Ω-cm by maintaining the carbon concentration in the composite at a level above zero wt % and 3 wt %.

6. A method as defined in claim 5 wherein the substrate is separated from the codeposit to form a PBN compact.

* * * * *